United States Patent

Nalla

(10) Patent No.: US 8,946,087 B2
(45) Date of Patent: Feb. 3, 2015

(54) ELECTROLESS COPPER DEPOSITION

(75) Inventor: Praveen Reddy Nalla, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/364,924

(22) Filed: Feb. 2, 2012

(65) Prior Publication Data

US 2013/0203249 A1    Aug. 8, 2013

(51) Int. Cl.
*H01L 21/44*     (2006.01)
*H01L 21/4763*   (2006.01)
*H01L 21/20*     (2006.01)
*H01L 29/40*     (2006.01)

(52) U.S. Cl.
USPC ........... 438/678; 438/629; 438/672; 438/675; 438/584; 257/753; 257/774; 257/775

(58) Field of Classification Search
USPC ....... 438/678, FOR. 390, 629, 672, 675, 584; 257/753, 774, 775, E21.579, E21.586, 257/E21.585, E21.584, E21.583
See application file for complete search history.

(56) References Cited

U.S. PATENT DOCUMENTS

| | | | | |
|---|---|---|---|---|
| 5,963,832 A * | 10/1999 | Srinivasan et al. | | 438/672 |
| 6,140,227 A * | 10/2000 | Chen et al. | | 438/644 |
| 6,395,164 B1 * | 5/2002 | Andricacos et al. | | 205/157 |
| 6,664,122 B1 | 12/2003 | Andryuschenko et al. | | |
| 6,713,373 B1 * | 3/2004 | Omstead | | 438/608 |
| 7,294,574 B2 | 11/2007 | Ding et al. | | |
| 7,456,102 B1 | 11/2008 | Varadarajan et al. | | |
| 7,501,014 B2 | 3/2009 | Poole et al. | | |
| 7,651,934 B2 | 1/2010 | Lubomirsky et al. | | |
| 7,659,197 B1 | 2/2010 | Juliano | | |
| 2003/0186524 A1 * | 10/2003 | Ryo | | 438/597 |
| 2006/0202346 A1 * | 9/2006 | Shih et al. | | 257/774 |
| 2008/0182409 A1 * | 7/2008 | Seidel et al. | | 438/678 |
| 2009/0102058 A1 * | 4/2009 | Hsieh | | 257/774 |
| 2010/0285660 A1 * | 11/2010 | Lin et al. | | 438/650 |

* cited by examiner

*Primary Examiner* — Yasser A Abdelaziez
*Assistant Examiner* — Cory Eskridge
(74) *Attorney, Agent, or Firm* — Beyer Law Group LLP

(57) ABSTRACT

A method for providing metal filled features in a layer is provided. A metal seed layer is deposited on tops and bottoms of the features. Metal seed layer on tops of the features and overhangs is removed without removing metal seed layer on bottoms of features. An electroless deposition of metal is provided to fill the features, wherein the electroless deposition first deposits on the metal seed layer on bottoms of the features.

18 Claims, 3 Drawing Sheets

US 8,946,087 B2

ELECTROLESS COPPER DEPOSITION

BACKGROUND OF THE INVENTION

Field of the Invention

The invention relates to a method of forming semiconductor devices on a semiconductor wafer. More specifically, the invention relates to forming metal interconnects in low-k dielectric layers.

In forming semiconductor devices, conductive metal interconnects are placed in low-k dielectric layers. Generally, features are etched into a layer and then filled with a conductor, such as copper. Methods of filling etched features with copper are described in U.S. Pat. No. 7,294,574, entitled "Sputter Deposition and Etching of Metallization Seed Layer for Overhang and Sidewall Improvement," by Ding et al., issued Nov. 13, 2007; U.S. Pat. No. 7,659,197, entitled "Selective Resputtering of Metal Seed Layers," by Juliano, issued Feb. 9, 2010, U.S. Pat. No. 6,664,122 entitled "Electroless Copper Deposition Method for Preparing Copper Seed Layers," by Andryuschenko et al., issued Dec. 16, 2003, U.S. Pat. No. 7,456,102, entitled "Electroless Copper Fill Process," by Varadarajan et al., issued Nov. 25, 2008, U.S. Pat. No. 7,501,014 entitled "Formaldehyde Free Electroless Copper Compositions," by Poole et al., issued Mar. 10, 2009, and U.S. Pat. No. 7,651,934, entitled "Process for Electroless Copper Deposition," by Lubomirsky et al., issued Jan. 26, 2010, which are all incorporated by reference for all purposes.

SUMMARY OF THE INVENTION

To achieve the foregoing and in accordance with the purpose of the present invention, a method for providing metal filled features in a layer is provided. A metal seed layer is deposited on tops and bottoms of the features. Metal seed layer on tops of the features and overhangs is removed without removing metal seed layer on bottoms of features. An electroless deposition of metal is provided to fill the features, wherein the electroless deposition first deposits on the metal seed layer on bottoms of the features.

In another manifestation of the invention, a method for providing copper or copper alloy filled features in a layer is provided. A barrier layer is deposited in the features. A copper or copper alloy seed layer is directionally and selectively deposited on tops and bottoms of the features with respect to sidewalls of the features. The copper or copper alloy seed layer on tops of the features and overhangs is removed without removing the copper or copper alloy seed layer on bottoms of features using a wet etch or chemical mechanical polishing. An electroless copper or copper alloy deposition is provided to fill the features, wherein the electroless copper or copper alloy deposition first deposits on the copper or copper alloy seed layer on bottoms of the features.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various methods of filling features in dielectric layer with metal contacts may cause voids. As feature size decrease, the impact of the voids increases, while making the avoidance of voids more difficult. An embodiment of the invention reduces voids caused while forming metal contacts in features.

Figure 1:
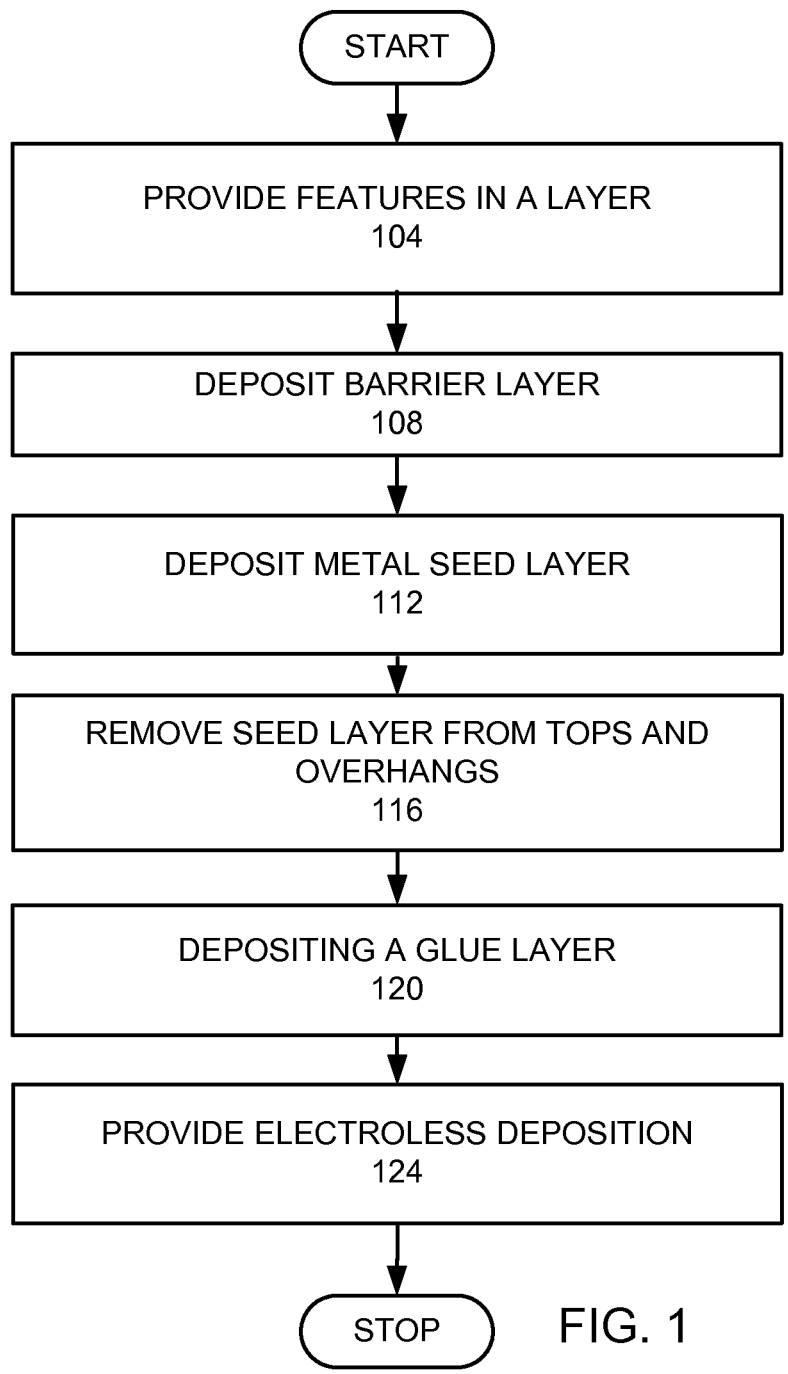
FIG. 1 is a flow chart of an embodiment of the invention.

FIG. 1 is a high level flow chart of an embodiment of the invention. In this embodiment, features are provided in a layer (step 104). A barrier layer is deposited over the surface of the layer in the features (step 108). A metal seed layer is deposited on the barrier layer (step 112). The metal seed layer is removed from top of the features and overhangs (step 116). The metal seed layer is selectively removed from the top of the features without removing the metal seed layer from the bottom of the features. A wet etch or chemical mechanical polishing (CMP) may be used to provide such a selective removal. A glue layer is deposited (step 120). An electroless deposition is used to deposit a metal such as cobalt or copper or other metal or alloys to fill the features with a conductive wiring or contact (step 124).

Figure 2A:
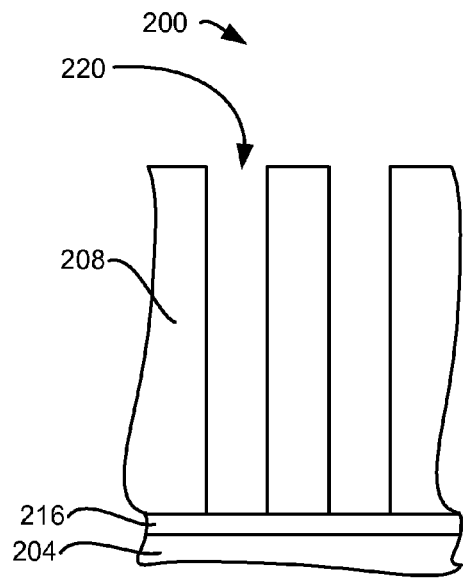
FIGS. 2A-G are schematic views of the formation of structures using the inventive process.

In a preferred embodiment of the invention, features are provided in a layer (step 104). FIG. 2A is a schematic cross-sectional view of a stack 200 with a substrate 204 with a layer 208 with features 220. In this example, one or more layers 216 are disposed between the substrate 204 and the layer 208. In this example the layer 208 with features 220 is a dielectric layer. More preferably, the layer 208 is a low-k dielectric layer, with a k value of less than 4.0. In this embodiment, the layer is organosilicate glass (OSG).

Figure 2B:
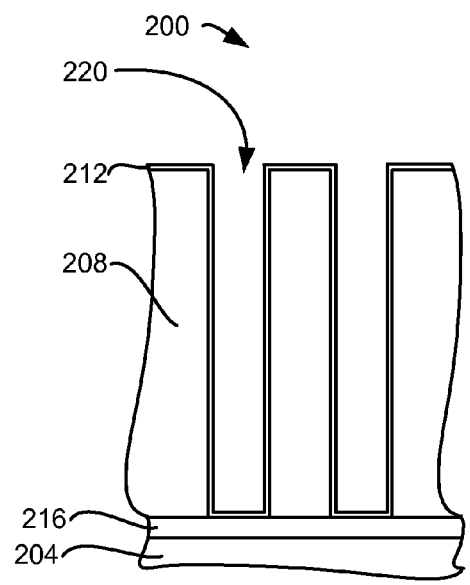

A barrier layer is deposited in the features (step 108). In this embodiment the barrier layer is a Co, Ta, TaN, or organic layer. In other embodiments the barrier layer may be a metal nitride layer, such as titanium nitride (TiN), ruthenium nitride, or tantalum nitride (TaN), or an amorphous carbon layer. FIG. 2B is a schematic cross-sectional view of the stack 200 after the barrier layer 212 has been deposited.

Figure 2C:
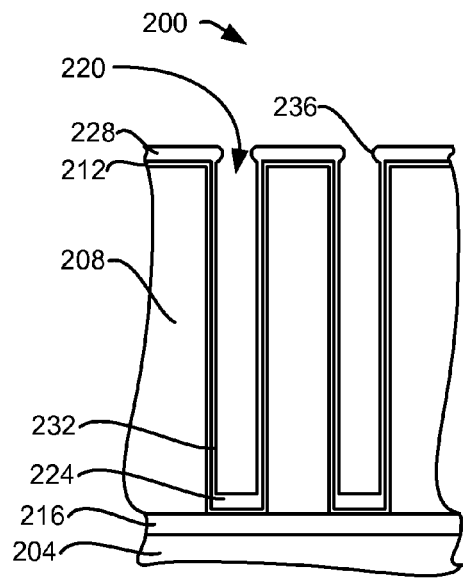

A metal seed layer is deposited on tops and bottoms of the features with respect to sidewalls of the features (step 112). In this embodiment, the metal seed layer is copper or a copper alloy, which is provided by a directional and selective deposition, which is provided by a physical vapor deposition (PVD). FIG. 2C is a schematic view of the stack after a copper seed layer is directionally and selectively deposited on tops and bottoms of the features with respect to the sidewalls of the features. As shown, there are larger depositions on the bottoms of the features 224, large depositions on tops of features 228, and little or no depositions on sidewalls 232. In this embodiment, overhangs 236 near the tops of the features are also formed. The relative thicknesses of the depositions are not drawn to scale in order to be able to clearly illustrate the different layers. Preferably, the thickness of the copper deposition on the bottoms of features 224 to the thickness of the copper deposition on the sidewalls is at least 10:1. More preferably, the ratios of the thickness of the copper deposition on bottoms of features 224 to the thickness of the copper deposition on the sidewalls are at least 100:1. Most preferably, no copper is deposited on the sidewall of the features. A directional physical vapor deposition (PVD) is able to provide a selective deposition with minimal deposition on the sidewalls of the features.

Figure 2D:
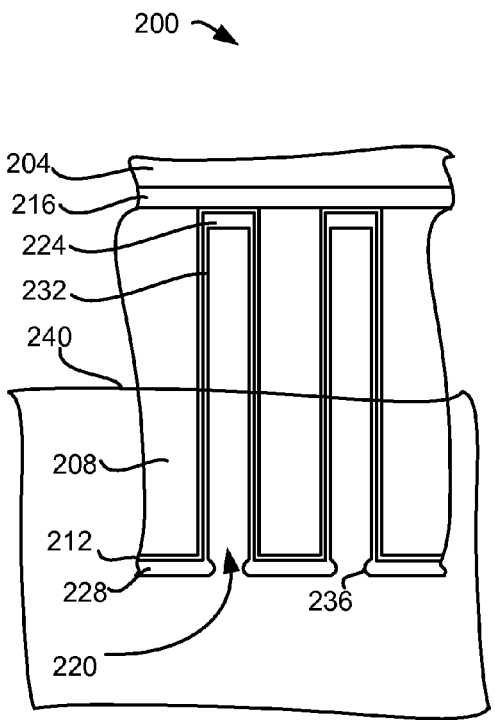
Figure 2E:
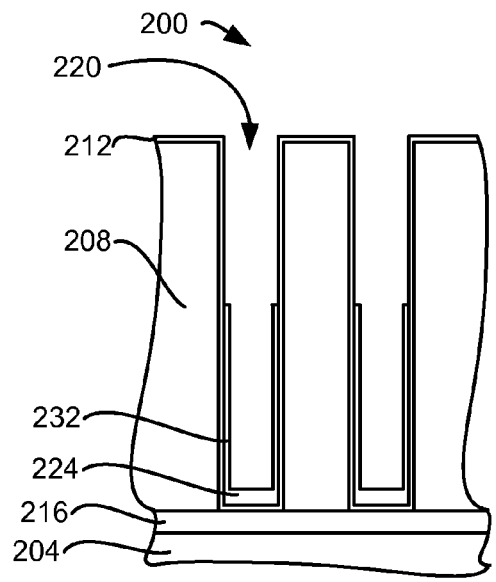

The metal seed layer is selectively removed from tops of the features, which also removes any seed layer overhangs and does not remove the metal seed layer at the bottoms of the features (step 116). In this embodiment, this is accomplished by placing the stack 200 upside down in a wet bath. FIG. 2D is a schematic illustration of the stack 200 placed upside down in a wet bath 240. As shown, the metal seed layer on tops of the features 228 and the overhangs 236 are exposed to the wet bath 240, but the metal seed layer deposited on the bottoms of the features 224 are not exposed to the wet bath 240. As a result, the metal seed layer on the tops of the features 228 and the overhangs 236 are removed without removing the metal seed layer on the bottoms of the features 224. Preferably, all of the metal seed layer on the tops of the features is removed. The removal of the overhang allows formation of contacts with reduced voids caused by the overhang. In this embodiment the wet bath is an acid bath with an oxidizer. FIG. 2E is a schematic illustration of the stack after the metal seed layer on the tops of the features 228 and overhangs 236 has been removed without removing the metal seed layer at the bottoms of the features 224.

Figure 2F:
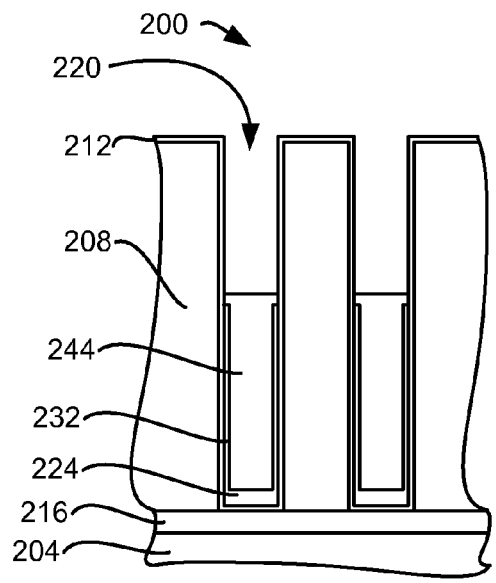
Figure 2G:
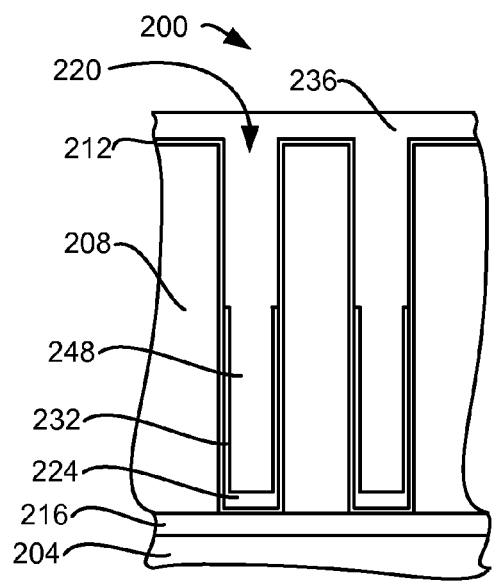

In this embodiment, a glue layer is applied to the stack (step 120). The glue layer may be provided by providing an organic self assembled monolayer (SAM) layer using a wet bath or vapor spray. The stack 200 is then subjected to an electroless deposition (step 124). In this embodiment, the electroless deposition forms a copper or copper alloy contact in the features. FIG. 2F is a schematic illustration of a stack partly through the electroless deposition forming parts of copper contacts 244. It should be noted that the contacts are first formed at the bottom of the features. FIG. 2G is a schematic illustration of a stack after the electroless deposition is completed, where completed copper contacts 248 are formed in the features. Additional process may be used to further form the features, such as an etch back or chemical mechanical polishing (CMP) may be used remove copper over the tops of the features.

In various embodiments, preferably the feature depth to feature width aspect ratio is at least 5:1. More preferably the aspect ratio is at least 15:1. Most preferably, the aspect ratio is between 4:1 to 15:1. Preferably, the CD is less than 400 nm. More preferably, the CD is less than 300 nm. Most preferably, the CD is less than 100 nm. Different embodiments may be used to fill features that are trenches or contacts.

In other embodiment chemical vapor deposition (CVD) or electroless deposition may be used to deposit the metal seed layer. In such embodiments, the metal seed layer deposition may be conformal instead of directional or selective.

In another embodiment, a chemical mechanical polishing (CMP) is used to remove the copper at the tops of the features and overhangs. In another embodiment, the glue layer may be deposited after depositing the seed layer and before removing the metal seed layer from the tops of the features. In another embodiment, the glue layer may be applied before depositing the metal seed layer. In one embodiment, the glue layer is applied using a polymer deposition that provides functionalized groups. If a polymer is used as a glue layer and is deposited after the metal seed layer is deposited, it is desirable to remove the glue layer from the metal seed layer on the bottom of the features to enhance the electroless copper deposition. Adhesion between the copper and the sidewalls of the features is desirable to reduce copper migration. However, in other embodiments, a glue layer is not deposited. In other embodiments a barrier layer may not be used. In such a case, a glue layer may be applied before the metal seed layer.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for providing metal filled features in a layer comprising:
   depositing a metal seed layer on tops and bottoms of the features;
   removing the metal seed layer on tops of the features and overhangs and on at least part of the sidewalls within the features without removing any of the metal seed layer on bottoms of features; and
   providing an electroless deposition of metal to fill the features, wherein the
   electroless deposition first deposits on the metal seed layer on bottoms of the features,
   wherein the depositing the metal seed layer deposits the metal seed layer on bottoms of the features with respect to sidewalls of the features at a thickness ratio of at least 10:1.

2. The method, as recited in claim 1, further comprising depositing a barrier layer in the features, before depositing the metal seed layer.

3. The method, as recited in claim 2, further comprising depositing a glue layer on the barrier layer.

4. The method, as recited in claim 3, wherein the removing the metal seed layer on tops of the features and overhangs comprises providing a wet etch or chemical mechanical polishing.

5. The method, as recited in claim 4, wherein the depositing the metal seed layer deposits metal seed layer on bottoms of the features with respect to sidewalls of the features at a thickness ratio of at least 100:1.

6. The method, as recited in claim 5, wherein at least one of the features has depth to width aspect ratio of between 4:1 to 15:1.

7. The method, as recited in claim 6, wherein the features have a CD of less than 100 nm.

8. The method, as recited in claim 7, wherein the deposition of metal is a deposition of copper or copper alloy.

9. The method, as recited in claim 8, wherein the metal seed layer is a copper or copper alloy seed layer.

10. The method, as recited in claim 1, wherein the depositing the metal seed layer comprises providing at least one of physical vapor deposition, chemical vapor deposition, or electroless deposition.

11. The method, as recited in claim 1, wherein the removing the metal seed layer on tops of the features and overhangs comprises placing features in the layer upside down in a wet bath.

12. The method, as recited in claim 1, wherein at least one of the features has depth to width aspect ratio of between 4:1 to 15:1.

13. The method, as recited in claim 1, wherein the deposition of metal is a deposition of copper or copper alloy.

14. The method, as recited in claim 1, wherein the metal seed layer is a copper or copper alloy seed layer.

15. The method, as recited in claim 1, wherein the depositing the metal seed layer comprises providing a physical vapor deposition.

16. A method for providing copper or copper alloy filled features in a layer comprising:
   depositing a barrier layer in the features;
   directionally and selectively depositing a copper or copper alloy seed layer on tops and bottoms of the features with respect to sidewalls of the features;
   selectively removing the copper or copper alloy seed layer on tops of the features and overhangs and on at least part of the sidewalls within the features without removing any of the copper or copper alloy seed layer on bottoms of features using a wet etch or chemical mechanical polishing; and
   providing an electroless copper or copper alloy deposition to fill the features, wherein the electroless copper or copper alloy deposition first deposits on the copper or copper alloy seed layer on bottoms of the features.

17. The method of claim 1, wherein the metal seed layer is deposited on the sidewalls of the features continuously from the bottoms of the features to the tops of the features.

18. The method of claim 16, wherein the metal seed layer is deposited on the sidewalls of the features continuously from the bottoms of the features to the tops of the features.

* * * * *